(12) United States Patent
Hutzler et al.

(10) Patent No.: US 11,491,567 B2
(45) Date of Patent: Nov. 8, 2022

(54) SOLDERING DEVICE AND A METHOD FOR PRODUCING A SOLDER CONNECTION OF COMPONENTS USING ADHESIVE MATERIAL FOR TEMPORARY CONNECTION OF THE COMPONENTS

(71) Applicant: PINK GmbH Thermosysteme, Wertheim (DE)

(72) Inventors: Aaron Hutzler, Nuremberg (DE); Christoph Oetzel, Wertheim (DE)

(73) Assignee: PINK GmbH Thermosysteme, Wertheim (DE)

( * ) Notice: Subject to any disclaimer, the term of this patent is extended or adjusted under 35 U.S.C. 154(b) by 331 days.

(21) Appl. No.: 16/610,966

(22) PCT Filed: May 7, 2018

(86) PCT No.: PCT/EP2018/061727
§ 371 (c)(1),
(2) Date: Nov. 5, 2019

(87) PCT Pub. No.: WO2018/202919
PCT Pub. Date: Nov. 8, 2018

(65) Prior Publication Data
US 2020/0101549 A1 Apr. 2, 2020

(30) Foreign Application Priority Data

May 5, 2017 (DE) .................... 10 2017 109 747.3
Aug. 28, 2017 (DE) .................... 20 2017 105 174.9

(51) Int. Cl.
*B23K 3/08* (2006.01)
*B23K 1/00* (2006.01)
(Continued)

(52) U.S. Cl.
CPC ............ *B23K 3/087* (2013.01); *B23K 1/0016* (2013.01); *B23K 1/206* (2013.01); *H01L 24/75* (2013.01);
(Continued)

(58) Field of Classification Search
None
See application file for complete search history.

(56) References Cited

U.S. PATENT DOCUMENTS 4,801,069 A   1/1989   Ankrom et al.
5,175,410 A   12/1992  Freedman et al.
(Continued)

FOREIGN PATENT DOCUMENTS

JP   2016183102 A   10/2016
WO   2016091962 A1   6/2016

OTHER PUBLICATIONS

PCT Notification of Transmittal of Translation of the International Preliminary Report on Patentability for PCT/EP2018/061727, dated Nov. 7, 2019, 8 pages.
(Continued)

*Primary Examiner* — Devang R Patel
(74) *Attorney, Agent, or Firm* — Dinsmore & Shohl LLP

(57) ABSTRACT

The invention relates to a method for producing a solder connection between a plurality of components (12A, 12B) in a process chamber (74) sealed off from its surroundings by heating and melting solder material (16) which is arranged between the components (12A, 12B) to be connected.
It is proposed that the components (12A, 12B) to be connected are provisionally connected with a bonding material (18) to form a solder group (10) in which the components (12A, 12B) are fixed relative to one another in a joining position.

20 Claims, 10 Drawing Sheets

Figure 1:
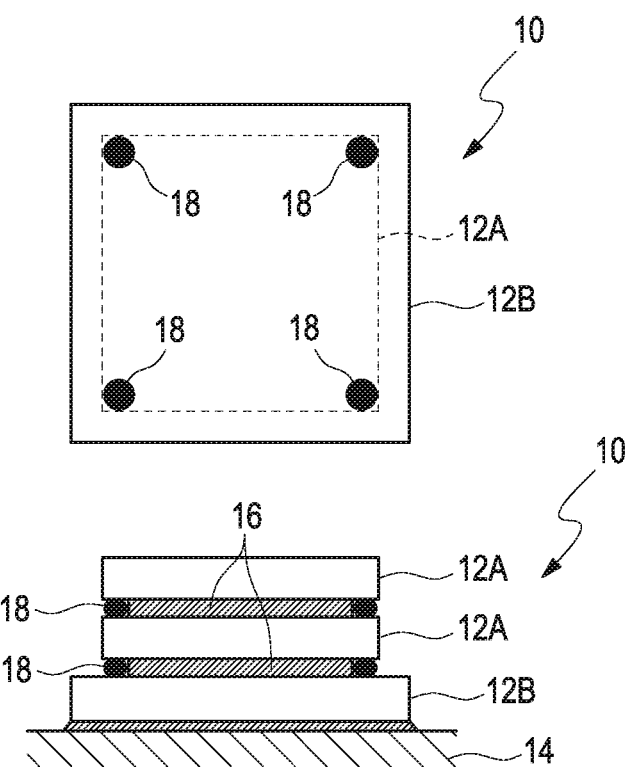

(51) Int. Cl.
   *H01L 23/00*   (2006.01)
   *B23K 1/20*   (2006.01)
   *H01L 25/065*   (2006.01)
   *H01L 25/00*   (2006.01)
   *B23K 101/42*   (2006.01)

(52) U.S. Cl.
   CPC .............. *H01L 24/81* (2013.01); *H01L 24/83* (2013.01); *H01L 25/0657* (2013.01); *H01L 25/50* (2013.01); *B23K 2101/42* (2018.08); *H01L 24/16* (2013.01); *H01L 24/17* (2013.01); *H01L 24/32* (2013.01); *H01L 24/33* (2013.01); *H01L 24/73* (2013.01); *H01L 24/92* (2013.01); *H01L 2224/16145* (2013.01); *H01L 2224/17181* (2013.01); *H01L 2224/32145* (2013.01); *H01L 2224/33181* (2013.01); *H01L 2224/73204* (2013.01); *H01L 2224/73253* (2013.01); *H01L 2224/7501* (2013.01); *H01L 2224/75252* (2013.01); *H01L 2224/75301* (2013.01); *H01L 2224/81203* (2013.01); *H01L 2224/81801* (2013.01); *H01L 2224/81911* (2013.01); *H01L 2224/83203* (2013.01); *H01L 2224/83801* (2013.01); *H01L 2224/83911* (2013.01); *H01L 2224/9211* (2013.01); *H01L 2225/06513* (2013.01)

(56) References Cited

U.S. PATENT DOCUMENTS

| | | | |
|---|---|---|---|
| 5,881,453 | A | 3/1999 | Avery et al. |
| 6,344,407 | B1 * | 2/2002 | Matsuki ................. H01L 24/11 |
| | | | 257/E23.021 |
| 8,191,758 | B2 * | 6/2012 | Sawada ................ B23K 1/0016 |
| | | | 29/843 |
| 8,757,474 | B2 * | 6/2014 | Abe ........................ H01L 24/75 |
| | | | 228/180.21 |
| 8,864,011 | B2 * | 10/2014 | Abe .................... B23K 1/0016 |
| | | | 228/43 |
| 10,610,981 | B2 * | 4/2020 | Hayashi ................. B23K 3/04 |
| 10,842,300 | B2 * | 11/2020 | Reid ....................... A47G 7/044 |
| 2009/0085227 | A1 | 4/2009 | Shiraishi et al. |
| 2013/0102112 | A1 | 4/2013 | Chen et al. |
| 2015/0314385 | A1 | 11/2015 | Abe et al. |
| 2016/0340242 | A1 | 11/2016 | Haas et al. |

OTHER PUBLICATIONS

PCT International Search Report and Written Opinion of the International Searching Authority for PCT/EP2018/061727, dated Aug. 27, 2018, 13 pages.

* cited by examiner

SOLDERING DEVICE AND A METHOD FOR PRODUCING A SOLDER CONNECTION OF COMPONENTS USING ADHESIVE MATERIAL FOR TEMPORARY CONNECTION OF THE COMPONENTS

CROSS-REFERENCE TO RELATED APPLICATION

The present application is National Stage Application filed under 35 U.S.C. § 371 of International Application No. PCT/EP2018/061727, filed May 7, 2018 and entitled "SOLDERING DEVICE AND A METHOD FOR PRODUCING A SOLDER CONNECTION OF COMPONENTS USING ADHESIVE MATERIAL FOR TEMPORARY CONNECTION OF THE COMPONENTS," which claims priority to German Patent Application No. 10 2017 109 747.3, dated May 5, 2017 and claims priority to German Utility Model No. 20 2017 105 174.9, dated Aug. 28, 2017, each of which is incorporated by reference herein in their respective entireties.

The present invention relates to a method for producing a solder connection between a plurality of components in a process chamber sealed off from its surroundings by heating and melting solder material which is arranged between the components to be connected.

BACKGROUND OF THE INVENTION

The term "components" is taken generally to mean circuit carriers, substrates, substrate carriers, base plates, workpiece carriers, mounting carriers or the like made from metal, ceramics, plastics or other materials or any desired to combinations of material together with components to be fastened thereto, such as power semiconductor chips, (semi-)conductor) assemblies or the like.

A method of the type in question is in particular used in large-area soldering operations, in which for example semiconductor components, microelectronic components or power semiconductor chips, such as for example transistors or diodes on printed circuit boards, IGBTs, MOSFETs or diodes on metallised ceramic substrates or other circuit carriers are soldered or soldered together, or in which metallised ceramic substrates are soldered to metallic base plates and/or heat sinks. Printed circuit boards which are to be connected to heat sinks may also be soldered in a soldering apparatus of the type in question.

In order to achieve an optimum soldering result, effort is made to heat the molten solder together with the components to be connected in controlled manner to above the melting point of the solder, also at an elevated pressure of greater than 1013 mbar, and then to perform cooling in controlled manner to below the solidification point of the solder in order to connect the components together without voids.

Solder connections are generally produced in a process chamber which is sealed off from its surroundings, in particular is evacuatable, in which is arranged a soldering apparatus which comprises a base plate and a pressure plate, between which is received a solder group comprising the component(s) and the solder material. The base plate and the pressure plate are adjustable relative to one another with regard to the spacing thereof for exerting a pressure force on the solder group. At the same time, the pressure plate and/or the base plate may heat and/or cool the components and the solder material. To this end, the stated plates may be thermally coupled with appropriate heat sources and/or heat sinks.

In general, the components and the solder material, for example in the form of solder chips or solder powder, are assembled to form a stack before being introduced into the process chamber.

When, as is necessary, the components are handled outside and/or within the process chamber and also during the actual soldering operation, there is however a risk, once the molten solder material has solidified, of the components not being in the desired position relative to one another. Deviations may occur with regard both to a lateral position of the components and to the relative spacing thereof.

U.S. Pat. No. 4,801,069 A discloses a method and an arrangement for solder connecting components in a gas atmosphere, wherein in a first step a solder chip is positioned by means of a bonding material on a printed circuit board as circuit carrier and at least temporarily fastened by means of heating, and in a subsequent step a component to be soldered is temporarily fastened to the solder chip and the circuit carrier with a further bonding material with application of pressure prior to a soldering operation. The operation has multiple stages and involves repeated heating and cooling of the components, which means that processing is not only costly in energy terms and involves exposure to high thermal loads but is also relatively time-consuming. The multistage arrangement steps can easily result in mispositioning. The multistage nature of the method means that it cannot be implemented under a vacuum atmosphere.

US 2009/0 085 227 A1 proposes a method and an apparatus for flip chip connection of a component to a circuit carrier, in which predefined spacing is achieved by a mounting apparatus with a placement frame which, guided by a vacuum suction device, places a component to be connected onto a circuit carrier. Once the component to be connected has been positioned on the circuit carrier by means of the placement frame, it is connected by heating a solder powder resin located therebetween, wherein a gas atmosphere of the solder material is formed which outgasses by convection, such that only contact surfaces which are to be connected are soldered. Neither a bonding agent for temporary alignment and fastening nor further application of pressure during and after the joining operation are here proposed in order subsequently to maintain a minimum spacing and orientation relative to one another.

U.S. Pat. No. 5,175,410 A discloses a hold-down fixture for the electrical contact feet of a component to be soldered on a circuit carrier for chip-on-tape mounting, wherein the hold-down fixture presses contact feet projecting from the periphery of the component onto the surface of the circuit carrier during the soldering operation. Outer bars are intended to press the end regions to be soldered of the contact feet against the solder pads of the circuit carrier, while inner bars rest directly against the package of the component to be soldered. Only selected regions of the component which are to be connected are therefore pressed directly onto the circuit carrier, and no predefinable structural height of the overall solder group is made possible, so controlled soldering of regions between the component and circuit carrier is not possible in this manner. The hold-down fixture is only usable for components with peripheral, externally located contact feet.

The problem addressed by the invention is that of providing a method of the initially stated type in which the components may be connected together more quickly and inexpensively and with improved dimensional accuracy.

SUBJECT MATTER OF THE INVENTION

The problem is solved by a method having the features of claim 1. Advantageous configurations of the method are the subject matter of the subclaims.

The invention proposes that the components to be connected are provisionally connected with a bonding material to form a solder group in which the components are fixed relative to one another in a joining position. This prevents the components from slipping relative to one another during assembly to form the solder group and/or during handling of the solder group, for example on introduction into the process chamber.

The components are advantageously provisionally connected by the bonding material by adhesive forces which act at the interfaces between the bonding material and the components or the solder material.

According to one advantageous configuration, the bonding material is selected such that it evaporates without leaving any residue during production of the solder connection. As a consequence, it is ensured that the quality of the solder connection is not impaired by any residues of the bonding material.

The bonding material may be sprayed on over a wide area before or during positioning of the components on the workpiece carrier or purposefully applied, for example in the manner of an X-Y plotter, in spots, lines or over a wide area to previously determined points and regions provided for this purpose of the components, of the substrate carrier and/or of the workpiece carrier. Application of the bonding material is preferably automatic in order to permit high-throughput mass production.

The soldering method is preferably carried out with solder chips or "preforms", wherein it is possible to dispense with the use of soldering paste which optionally contains flux.

According to a further advantageous configuration, at an evaporation pressure which is lower than atmospheric pressure, the evaporation temperature of the bonding material is lower than the melting temperature of the solder material at atmospheric pressure or even at an elevated pressure of above 1013 mbar. As a consequence, it is ensured that the bonding material can completely evaporate even before the solder material has melted. It is not absolutely necessary for this purpose for the evaporation temperature of the bonding material at atmospheric pressure to be lower than the melting temperature of the solder material, it may also be higher.

A further advantageous configuration provides that the solder group is heated to an intermediate temperature which is lower than the melting temperature of the solder material at atmospheric pressure or also at an elevated pressure of above 1013 mbar, and that the pressure in the process chamber is reduced to a pressure below the evaporation pressure at the intermediate temperature, such that the bonding material evaporates. The pressure in the process chamber may advantageously be reduced only once the solder group has been heated to the intermediate temperature. It is, however, also possible to reduce the pressure even before the intermediate temperature is reached. The pressure may be reduced continuously or in steps. It should, however, be ensured that the bonding material has been able to evaporate before the solder material melts.

A further advantageous configuration provides that the pressure in the process chamber is initially reduced to a pressure above the evaporation pressure of the bonding material at the intermediate temperature, such that the bonding material does not yet evaporate, that subsequently a cleaning agent, in particular methanoic acid, hydrogen or a plasma, is introduced into the process chamber to clean the solder group, and that subsequently the pressure in the process chamber is reduced to a pressure below the evaporation pressure of the bonding material at the intermediate temperature. Introduction of a plasma into the process chamber is in particular also taken to mean production of the plasma in the process chamber itself, wherein a suitable substance to be ionised may optionally be introduced into the process chamber. The advantage in this configuration is that, even during the cleaning operation, there is still a provisional connection between the components and/or the solder material. On reduction of the pressure in the process chamber to a pressure below the evaporation pressure of the bonding material at the intermediate temperature, the bonding material and the cleaning material can be jointly discharged from the process chamber.

Alternatively, it is however also possible initially to evaporate the bonding material and only then to introduce the cleaning agent into the process chamber.

According to a further advantageous configuration, the intermediate temperature while the pressure in the process chamber is being reduced to a pressure below the evaporation pressure of the bonding material may be maintained at a predetermined temperature value or within a predetermined temperature range at least until evaporation of the bonding material is complete.

The stated temperature value or the stated temperature range are always below the melting temperature at standard pressure or also at an elevated pressure of above 1013 mbar. As a consequence, the risk of bonding material still being present on the solder group while the solder material is melting is further reduced.

A further advantageous configuration may provide that the bonding material is arranged in the region of edges and/or corners and/or the centre or in the centre region of the components to be connected and/or of the solder material. In this manner, the bonding material can be applied very simply.

An advantageous embodiment provides that the solder material melts once the bonding material has evaporated in order to prevent contamination of the solder material.

A further advantageous configuration may provide that the bonding material is liquid or pasty and in particular comprises a terpene alcohol, in particular isobornyl cyclohexanol. The desired liquid or pasty state of matter should prevail at least at room temperature and atmospheric pressure.

Suitable mixtures or solutions of various substances may also be used as the bonding material. In particular, a filler or thickener may also be added to the bonding material. It should, however, be ensured that even the constituents of the bonding material which are optionally solid at room temperature and atmospheric pressure are capable of evaporating at elevated temperature and reduced pressure in line with the above-stated conditions before the solder material has melted.

A further advantageous configuration provides that, at least while the solder material is melting, the solder group is received in a soldering apparatus arranged in the process chamber, wherein the soldering apparatus has a base plate and a pressure plate, between which is received the solder group and which are adjustable relative to one another with regard to the spacing thereof for exerting a pressure force on the solder group, and has a stop apparatus which limits the spacing between the base plate and the pressure plate to a minimum spacing, such that, once the solder material has melted, the solder group has a predetermined thickness. The soldering apparatus ensures that the components and the solder material are preloaded against one another and, once the solder material has melted, continue to be compressed, since the molten solder material can spread further between the components and optionally fill any small interspaces present there. The stop apparatus here limits the extent of pressing such that, once the solder material has solidified, the solder group has a defined thickness or height. Dimensional accuracy is further improved as a consequence since not only lateral shifts, but also deviations from a predetermined thickness or height of the component assembly can reliably be prevented. In addition, in the event of excessively strong pressing, solder material is prevented from being squeezed out laterally between the components. The invention differs from conventionally used soldering frames in that direct physical contact occurs only briefly, namely while the solder is in the molten state or at the onset of a solidification phase.

Permanent or mechanically fixing contact is avoided in order to avoid damaging or stressing the material.

The stop apparatus can particularly advantageously be used in a multichamber system for flow production. Such a system comprises at least two chambers, in particular three chambers, for preheating, connecting and cooling. The stop apparatus is advantageously provided at least in the cooling chamber in order to ensure mechanical alignment during solidification of the solder. The stop apparatus may furthermore also be used in the soldering chamber for connecting the components and may also be used in the preheating chamber for alignment prior to the joining operation. To this end, the stop apparatus may advantageously be guided through the system with a displaceable workpiece carrier.

According to one advantageous configuration, the stop apparatus is arranged on the base plate or the pressure plate.

According to a further advantageous configuration, the stop apparatus is adjustable, such that the minimum spacing can be set. This permits variable adaptation of the stop apparatus to different dimensions or to a different number of components to be connected.

A further advantageous configuration provides that the stop apparatus comprises a plurality of in particular length-adjustable stop elements. As a consequence, it is possible to ensure that dimensional accuracy can be maintained over the entire lateral extent of the solder group. In particular, tilting or tipping of the pressure and base plates relative to one another can be avoided.

According to one advantageous configuration, the stop elements may have an adjusting device, in particular an adjusting thread which interacts with a complementary adjusting device, in particular a complementary thread, provided on the base plate or the pressure plate. The desired adjustability of the stop apparatus can be straightforwardly achieved as a consequence.

A further advantageous configuration provides that the stop elements are arranged such that, on reaching the minimum spacing, they bear with a respective free end against a component of the solder group, against a base frame carrying one of the components or against the base plate. If the stop elements are intended to bear against a component of the solder group, said component should sensibly be a terminating component which as it were forms a bottom or top of the component stack and projects laterally beyond the other components of the solder group. The stop elements may, however, also come to a stop against other assemblies. For instance, the stop elements which are for example fastened to the pressure plate may come to a stop against a base frame which is used as a component carrier, or even against the base plate itself. The base frame may, for example, carry a circuit carrier as the terminating component of the solder group.

Temperature management in soldering and sinter-bonding processes in electrical engineering and electronics has a major influence on a product's quality, reliability and service life. During the solder material cooling phase, solder grains or islands may be formed as hardening proceeds, wherein material-specific characteristics such as the modulus of elasticity, the temperature coefficient of the solder material and the grain shape alignment of the solder can have a substantial influence on the joint. A fatigue characteristic of the joint is substantially dependent on the solder grain size. It has been found in the context of the invention that grain size and alignment can be purposefully influenced by purposeful temperature adjustment during the heating phase but in particular during the cooling phase. It is here desirable for temperature adjustment to be carried out not only from beneath the components, but also from above in order to improve process control. In this manner, any mechanical stresses which arise between the joined parts can be reduced, alignment improved and any tendency to warping minimised. According to an advantageous embodiment, the base plate and/or the pressure plate is thus heatable and/or coolable. The base plate and/or the pressure plate may for this purpose have a heat source and/or a heat sink which may be integrated into the base plate or into the pressure plate. The base plate and/or the pressure plate may also be thermally couplable or coupled with a heat source and/or a heat sink, for example a heating and/or cooling plate. In particular, the base plate and/or the pressure plate may be configured such that, in the region of a contact area with the components, they have a temperature gradient which makes it possible to heat and/or cool the components in such a manner that regions close to the edge of the components have a higher temperature than regions remote from the edge. This makes it possible for the solder material to solidify from the inside outwards, i.e. towards the edges. During the cooling process, still liquid solder material can continue to flow from the outside inwards. As a consequence, it is possible to avoid the formation of voids and/or cavities in the solder material due to shrinkage of the volume of the solder material during cooling. One exemplary configuration of such a device is disclosed in document WO 2016/091962 A1, the entire disclosure content of which is included by reference in the present application. In this manner, the temperature of the components can be purposefully controlled from above. In this respect, in addition to providing mechanical alignment, the pressure plate permits temperature control by purposeful heating and/or cooling of the top of the components. This may be utilised in particular during sintering, in particular pressure sintering, as the joining technology, so enabling both alignment and temperature control even after departure from the sintering press.

According to the above-stated exemplary embodiment of a temperature adjustment function of the base plate and/or pressure plate, it is particularly advantageous to carry out temperature adjustment in particular of the pressure plate or of surface regions of the pressure plate facing towards the top of the component by means of a thermofluid or by means of one or more temperature adjustment elements. The thermofluid used may be a heatable liquid, in particular water or a water-glycol mixture, preferably at an elevated fluid pressure of 2-3 bar or more, in order to permit rapid heating or cooling. An electrical temperature adjustment element, in particular an electrical heating resistor or a Peltier cooling element or the like, may likewise advantageously be used. An electrical element may here for example also be used as a heater and a cooling fluid for cooling or vice versa. A radiant heater, for example in the form of an infrared emitter, may likewise be used and in this manner the pressure plate may for example be heated from above by an IR emitter, advantageously also nonuniformly by IR spot emitters or by an IR radiation mask which only allows IR light to pass through and impinge on the pressure plate at selected to locations. The individual heating and cooling elements may conveniently be combined. Zone heating during different process phases and in different regions of the apparatus is thus possible, in order to achieve end-to-end temperature control during the joining process both on the bottom and the top of the components.

Projecting steps, in particular thermally conductive steps and projections, but also recesses and depressions, may particularly advantageously be formed on a temperature-adjustable pressure plate in order to expose different heights of components to pressure and to achieve good thermal coupling. The stop elements may to this end bear directly on the workpiece carrier or the base plate, or on further component parts such as jigs, component frames etc. The projections and steps of the cover plate may be spring-mounted relative to the cover plate, such that the contact pressure of the steps relative to the component surface is dependent on a relative spacing of the cover plate from the component surface. In this manner, it is possible to permit early temperature adjustment of the component prior to maximum application of pressure, whereby a solder temperature can be selectively maintained in the plasticised or in a liquid phase before a maximum contact pressure is applied.

It is advantageously possible to provide a plurality of pressure plates, each equipped with a stop apparatus, which are height-adjustable and displaceable relative to the workpiece carrier either jointly or individually. Individual components may thus be placed under pressure and contacted for temperature adjustment purposes with a time offset. The pressure plates may in each case define individual temperature adjustment zones or be set by a single temperature adjustment medium or a single temperature adjustment apparatus, such that components can be differently thermally treated from above in line with their heat capacity. If the individual pressure plates are individually displaceable, the contact pressure may be differently set depending on the component group.

The stop element(s) of the stop apparatus may be provided for thermal coupling to with surface regions of the components and the dimensions and shape thereof may be specifically configured for nonuniform input or dissipation of heat.

According to a further advantageous configuration, the soldering apparatus has a carrier unit on which the pressure plate is directly or indirectly spring-supported or spring-mounted. In principle, however, the base plate may alternatively or additionally be directly or indirectly spring-supported or spring-mounted. Spring support or mounting in particular ensures that the stop apparatus, in particular where a plurality of stop elements are present, can be uniformly supported against a corresponding opposing surface, i.e. a component, of the base plate or against the base frame. It is additionally ensured that an adjusting apparatus, which is provided for adjusting the relative position between base plate and pressure plate, does not apply an inadmissibly high pressure force and, as a consequence, potentially damage the soldering apparatus.

A further advantageous configuration may provide that the spring force which the pressure plate exerts on the solder group can be set. This may for example proceed by interchangeable springs of different length and/or with a different spring constant. Adjustable springs which for example set the effective length of the springs may also be provided. As a consequence, the pressure force acting on the solder group can be limited in addition to the pressure force limitation provided by the stop apparatus.

According to a further advantageous configuration, the base plate is adjustable relative to the carrier unit. It is accordingly for example possible to support the carrier unit on the process chamber, while the base plate can be adjusted. A reversed solution with a stationary base plate and an adjustable pressure plate is, however, also conceivable.

A further advantageous configuration may provide that the side of the pressure plate associated with the base plate is planar or has at least one projecting, in particular planar, step which is in contact with the solder group. The projecting step is advantageously smaller in cross-section, i.e. in the lateral extent thereof, than the solder group or the component in contact with the step, such that a lateral temperature gradient can be produced at least in the component directly in contact with the step.

Use of the invention is in particular advantageous in sintering, preferably in pressure sintering, in which permanent connection of the components may be achieved by use of pressure at reduced temperatures. Production faults and inadequate connections can be reduced markedly by purposefully aligning the components relative to one another and enabling height control. In particular, a further purposeful temperature adjustment by means of the stop apparatus from above, is capable of improving the joining process to the effect that further process parameters can be purposefully influenced and optimised.

DRAWINGS

Further advantageous embodiments of the invention are revealed by the description and the drawings.

Figure 2:
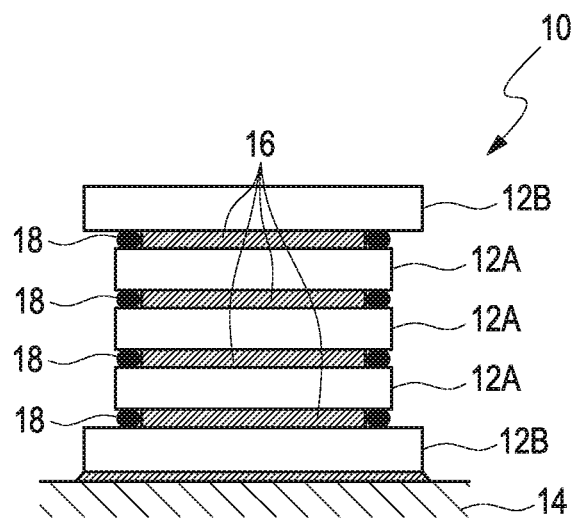
Figure 3:
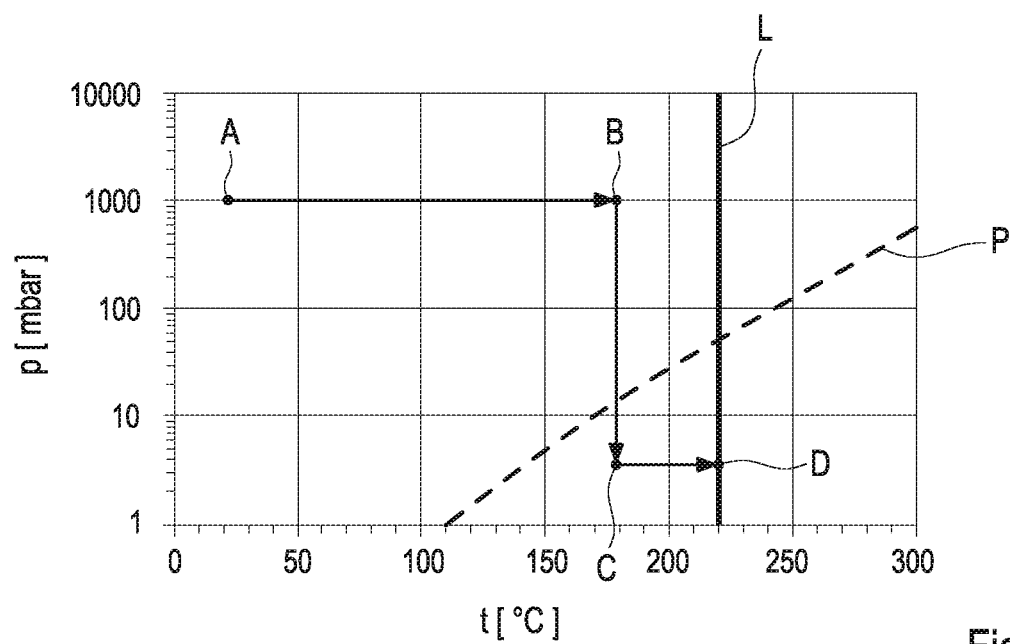
Figure 4:
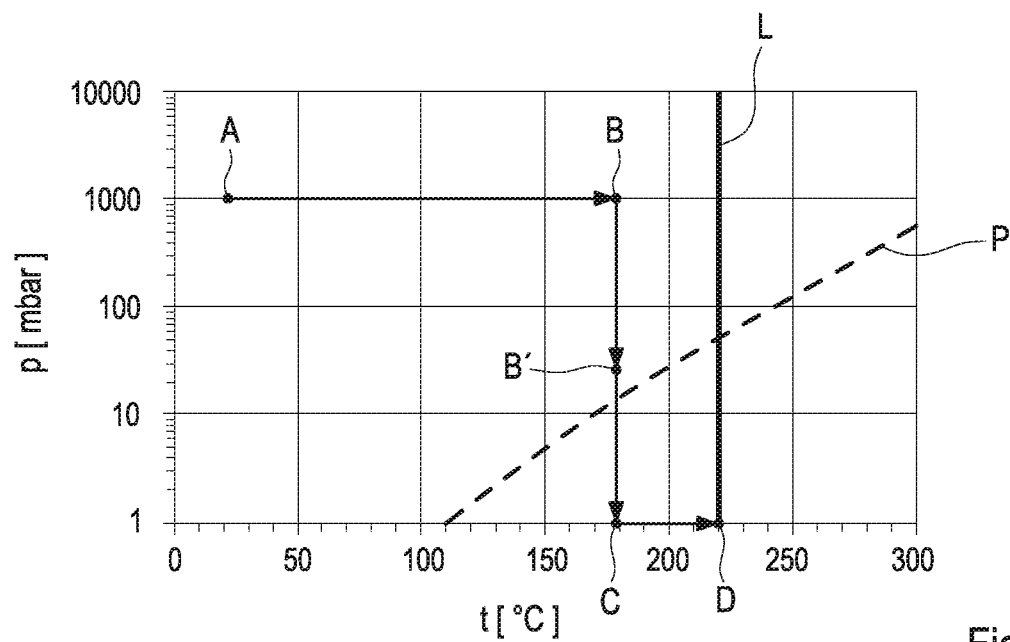
Figure 5:
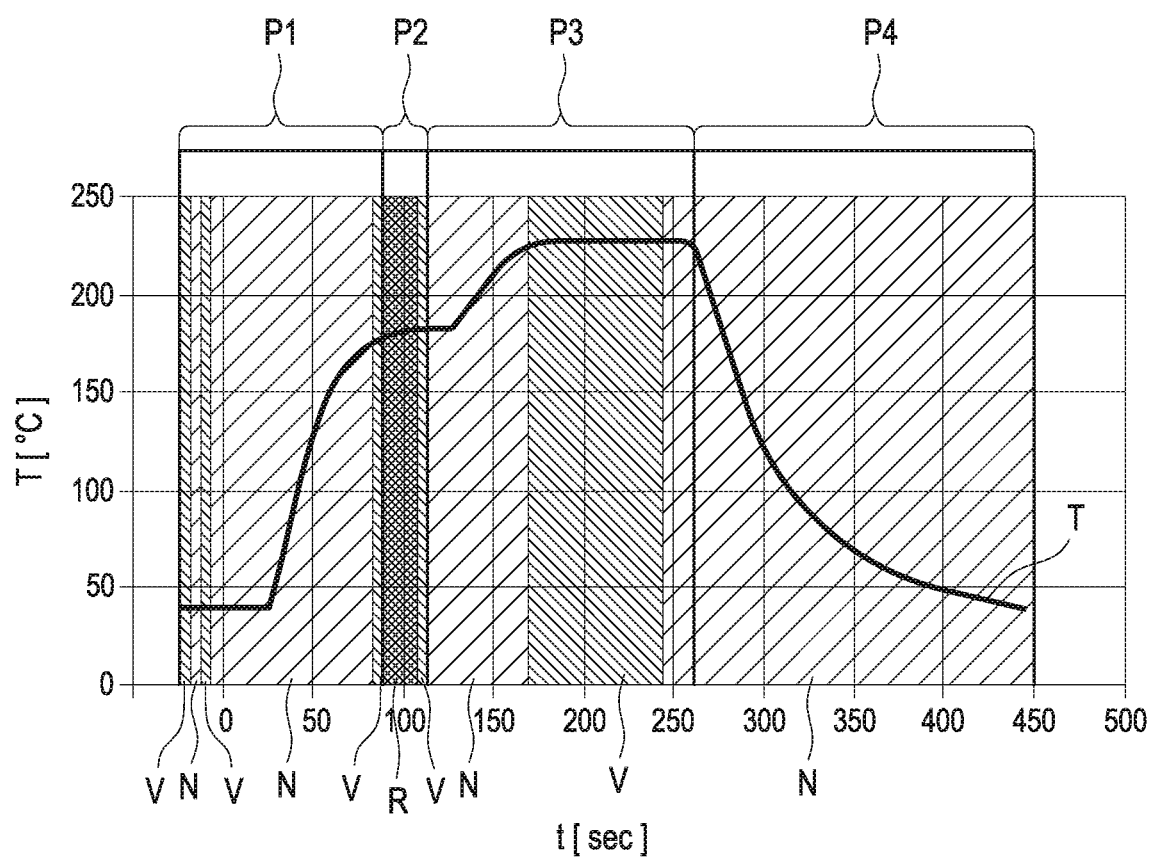
Figure 6:
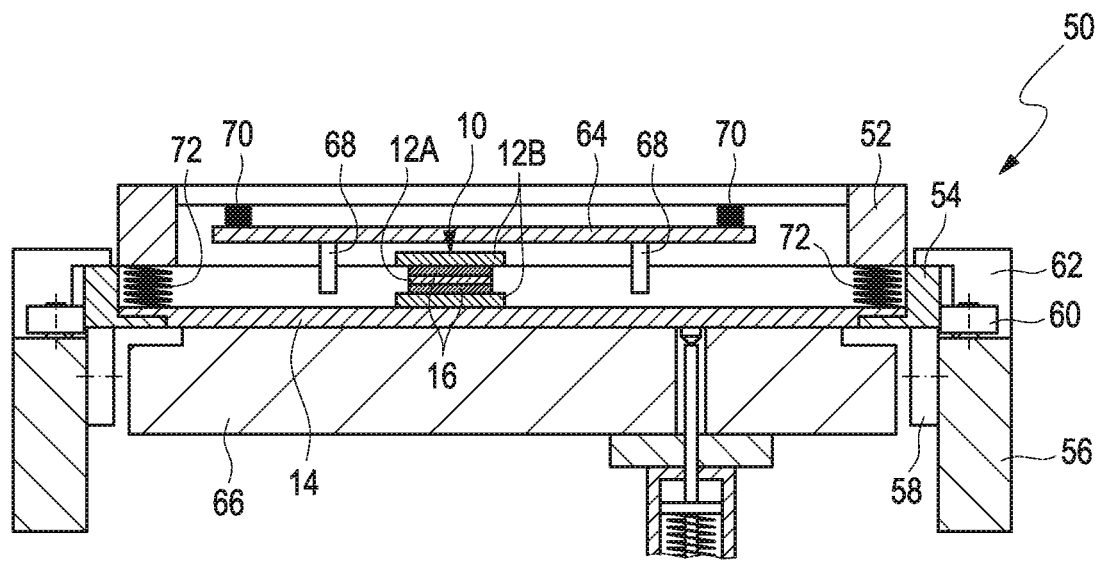
Figure 7:
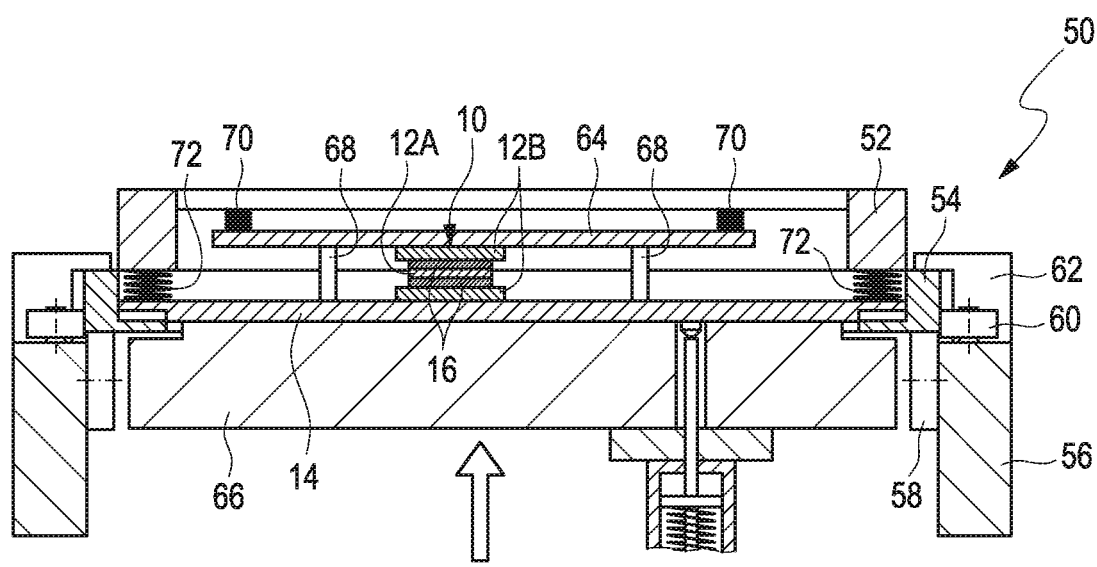
Figure 8:
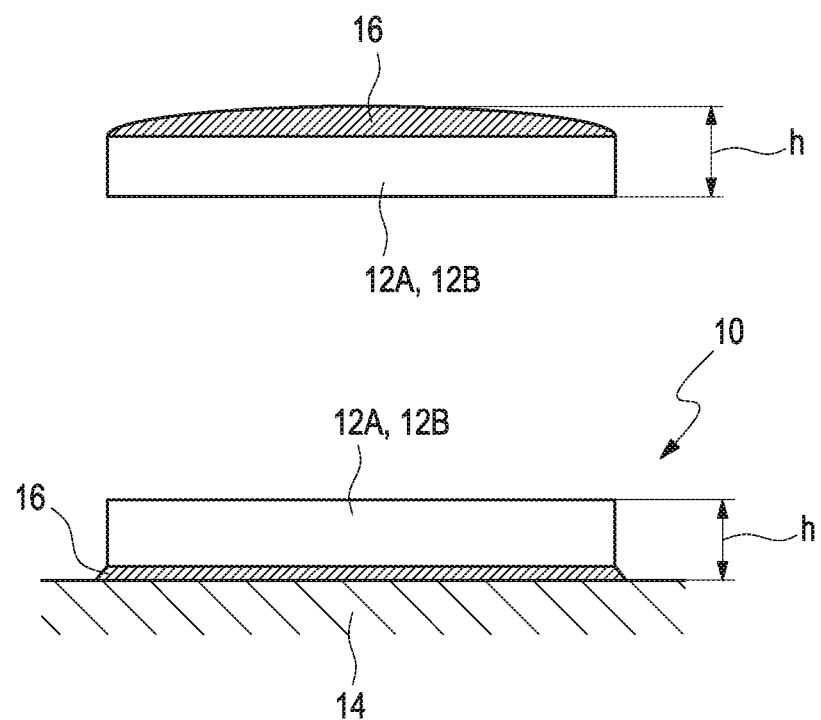
Figure 9:
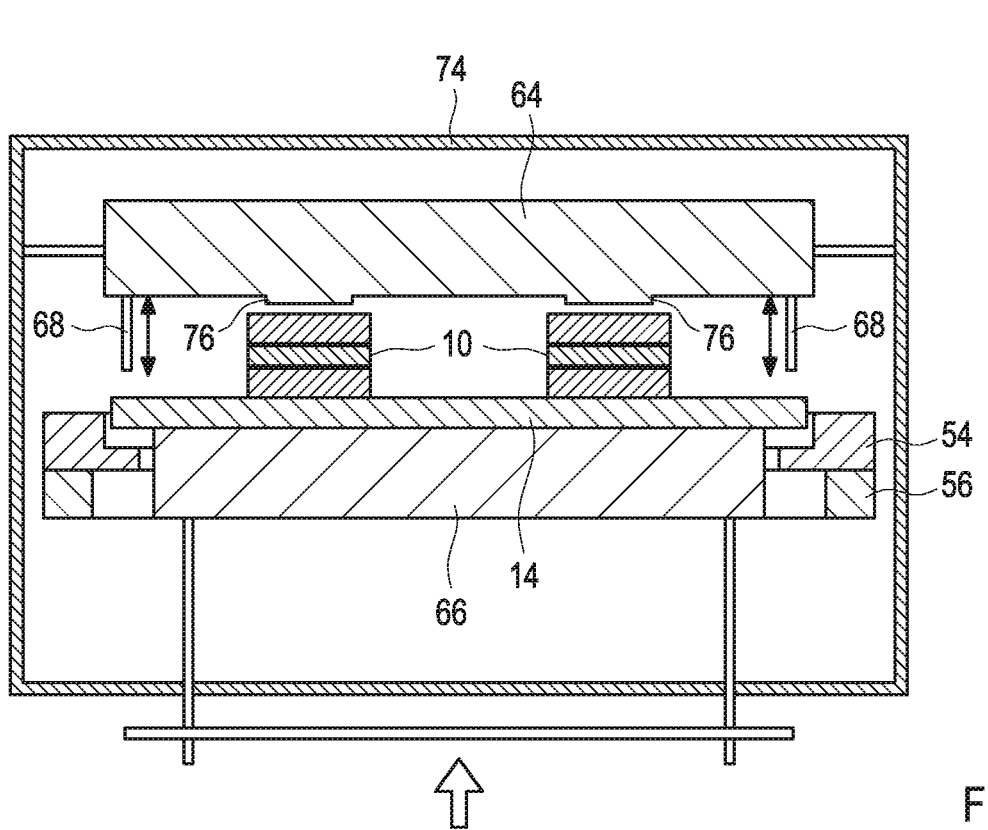
Figure 10:
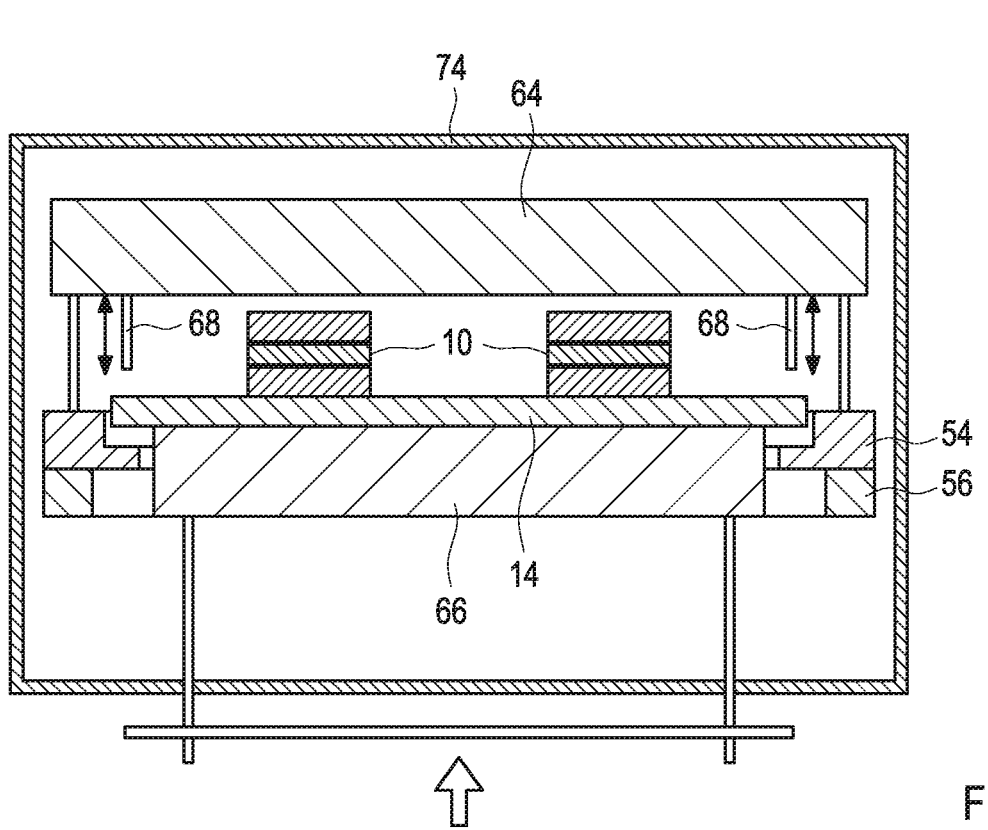
Figure 11A:
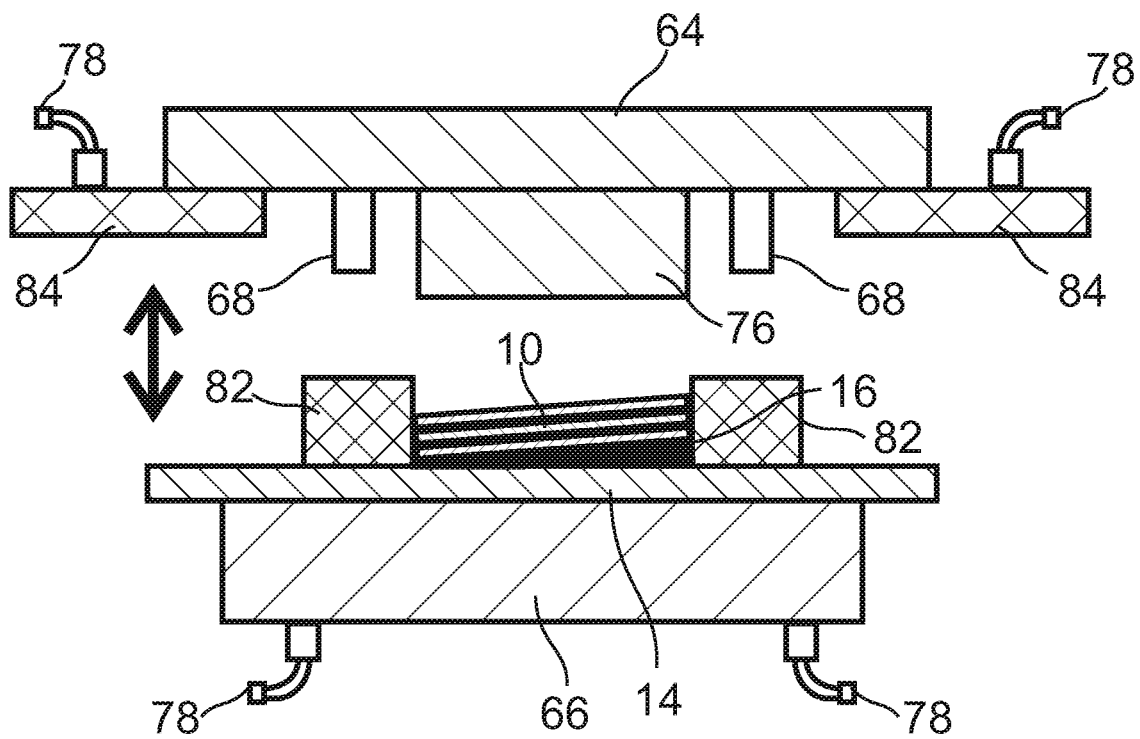
Figure 12A:
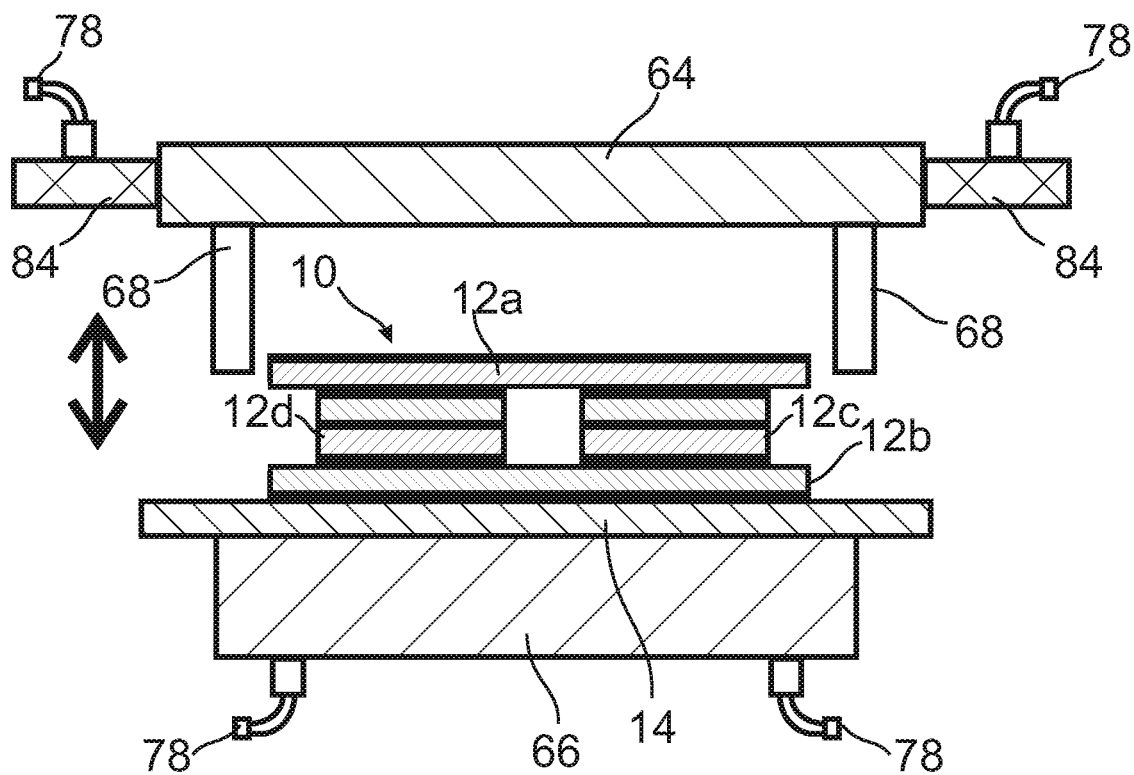
Figure 13A:
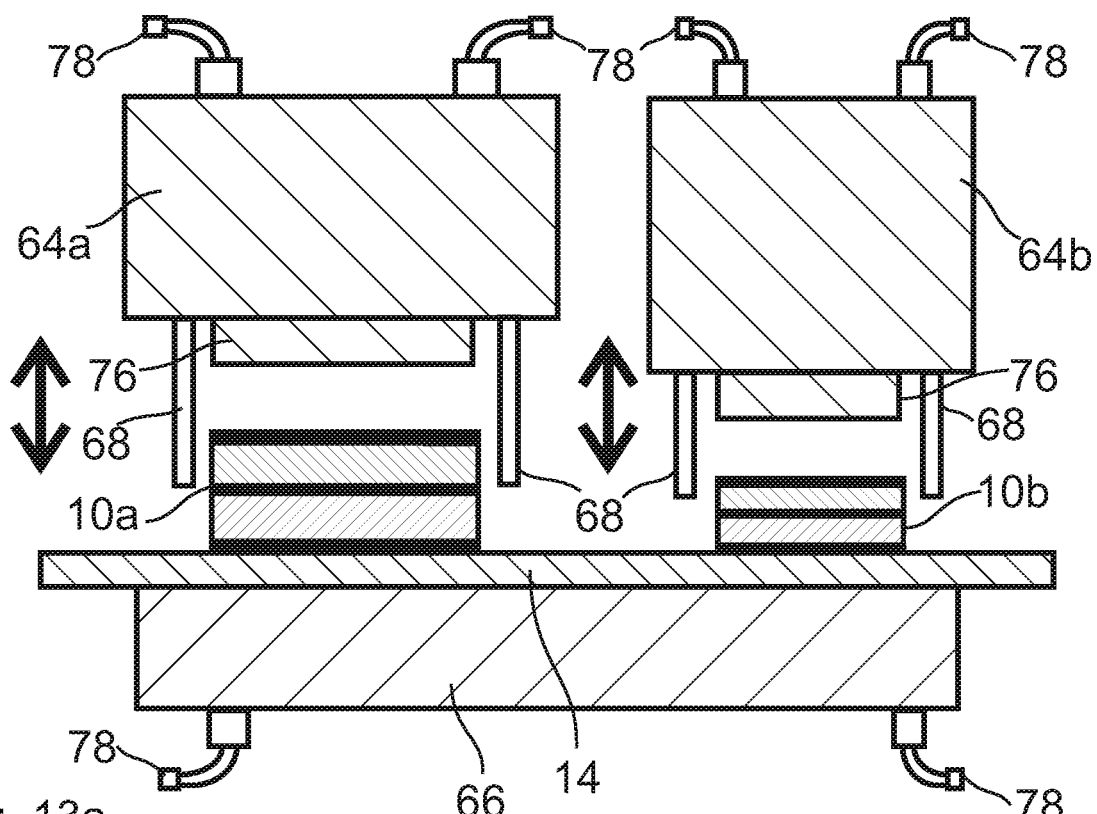
Figure 14A:
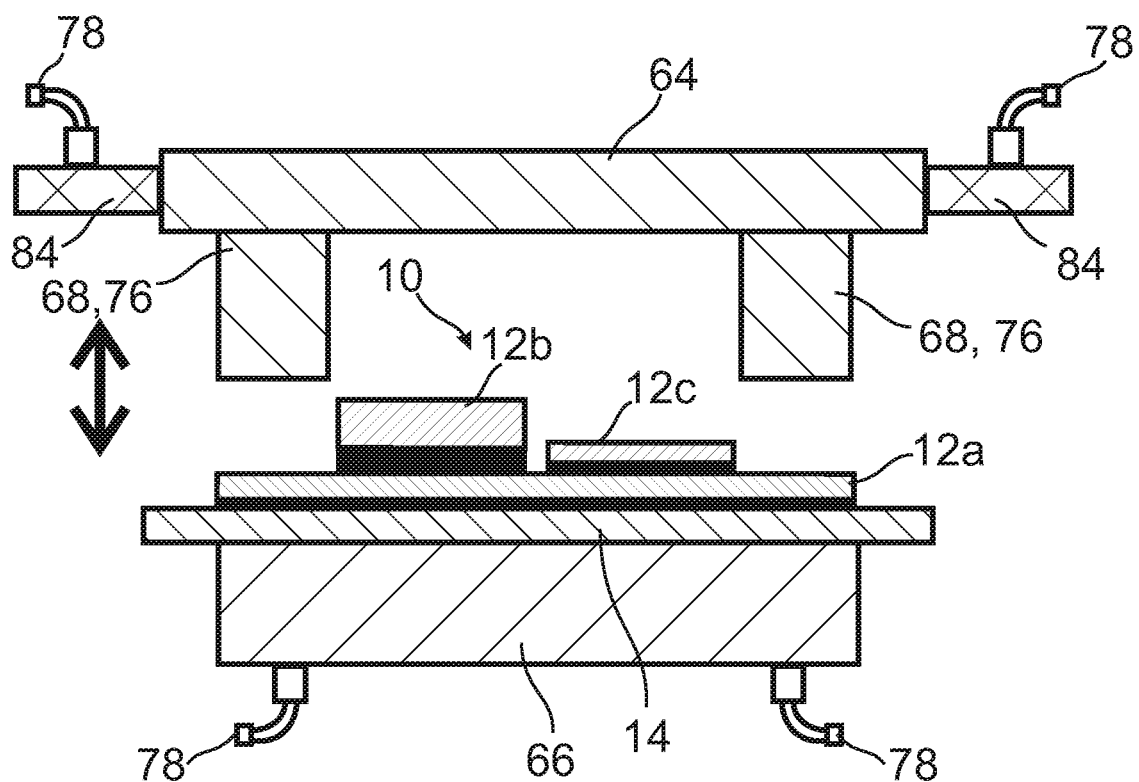

The invention is described below on the basis of exemplary embodiments and with reference to the drawings, in which:

FIGS. 1 & 2 show schematic diagrams of solder groups in side view and in part in plan view which are provisionally connected with a bonding material using the method of the invention, FIG. 3 shows a schematic pressure/temperature diagram for carrying out the method of the invention according to a first exemplary embodiment, FIG. 4 shows a schematic pressure/temperature diagram for carrying out the method of the invention according to a second exemplary embodiment, FIG. 5 shows a schematic temperature/time diagram for carrying out the method of the invention according to the first and/or second exemplary embodiment, FIGS. 6 & 7 show schematic, partially sectional side views of a soldering apparatus of the invention according to a first exemplary embodiment in various adjustment positions, FIG. 8 shows side views of various solder groups, and FIGS. 9 & 10 show schematic diagrams of a soldering apparatus of the invention arranged in a process chamber according to a second and a third exemplary embodiment;

FIGS. 11*a, b* show schematic diagrams of a soldering apparatus of the invention according to a fourth exemplary embodiment;

FIGS. 12*a, b* show schematic diagrams of a soldering apparatus of the invention according to a fifth exemplary embodiment;

FIGS. 13*a, b* show schematic diagrams of a soldering apparatus of the invention according to a sixth exemplary embodiment;

FIGS. 14a, b show schematic diagrams of a soldering apparatus of the invention according to a seventh exemplary embodiment.

FIGS. 1 and 2 show components 12A, 12B which are to be connected together with the assistance of solder material. Solder material 16, for example in the form of one or a plurality of solder pads, as are used, for example, in BGAs (Ball Grid Arrays), is arranged in each case between components 12A and 12B. Components 12A, 12B are in each case stacked on a further component in the form of a circuit carrier 14, wherein a component 12B lying directly on the circuit carrier 14 may already in a preceding step have been connected with the circuit carrier 14 or solder material 16 in as yet unmelted form may likewise have been provided there.

The components 12B are identical or somewhat larger in cross-section than the components 12A and may thus project a little beyond the latter on all sides. The solder material 16 arranged in the form of pads, in contrast, is somewhat smaller in cross-section than the components 12A, such that there are circumferential narrow cavities along the edges of the components 12A and 12B. In the region of the corners of the components, bonding material 18 in the form of small drops, which provisionally connects the components to form a respective solder group 10, is in each case introduced into these cavities. The bonding material 18 is preferably liquid or pasty and in particular comprises a terpene alcohol, in particular isobornyl cyclohexanol. Isobornyl cyclohexanol is for example obtainable under the trade name "Terusolve MTPH" from Nippon Terpene Chemicals, Inc.

The bonding material 18 fixes the components 12A, 12B relative to one another in a joining position by adhesion, such that they are secured at least in a lateral direction against unintentional slipping or displacement, for example by vibration during transfer into a process chamber.

A solder group 10, as shown in FIG. 1 or 2, may then be introduced into a process chamber which may comprise a soldering apparatus. FIGS. 9 and 10 show exemplary process chambers which are explained in greater detail below.

The process chamber is sealed off from its surroundings and has respective apparatuses which are capable of modifying the pressure in the process chamber and of respectively heating or melting the components 12A, 12B and the solder material 16. Further apparatuses which are capable of cooling the connected components 12A, 12B back down may furthermore be present in the process chamber. Alternatively, one or more further process chambers may be provided, into which one or more solder groups 10 may be automatically or manually transferred for cooling and/or for further processing steps.

A method for producing a solder connection between the components 12A, 12B will now be described below according to two different configurations.

The pressure/temperature diagrams (p/t diagrams) of FIGS. 3 and 4 use arrows to schematically represent changes in pressure and temperature between various process points. A liquidus curve L represents the phase boundary between the solid and liquid state of matter of the solder material 16, for example tin-silver-copper solder, and extends virtually independently of pressure at a temperature of approx. 220° C. A phase boundary P indicates the transition of the bonding material 18 from the liquid phase into the vapour phase as a function of temperature and pressure, wherein, above and to the left of the curve, the bonding material 18 is in the liquid phase and, below and to the right of the curve, it is in the vapour phase.

For isobornyl cyclohexanol as the bonding material 18, on which the p/t diagrams shown are based, the boiling point at atmospheric pressure is between 308° C. and 313° C. The boiling point of the bonding material can be reduced to below the melting point of the solder material by reducing the pressure in the process chamber. This makes it possible to heat the solder group 10 to close to the melting point of the solder material 16 without the bonding material 18 already evaporating.

Starting from a process point A, at which atmospheric pressure and room temperature prevail, initially only the temperature is raised until, at a process point B, a temperature of approx. 180° C. is reached.

In the exemplary embodiment according to FIG. 3, in a subsequent step the pressure in the process chamber is then reduced until a process point C at 180° C. and a pressure between 1 and 10 mbar is achieved. The phase boundary P is crossed during the transition from process point B to process point C, such that the bonding material 18 evaporates and can be discharged from the process chamber.

A cleaning agent, for example methanoic acid or hydrogen may then be introduced into the process chamber or a plasma may be introduced or produced in order to clean the components 12A, 12B to be connected.

In a following step, the temperature may then be raised from 180° C. to the melting temperature of the solder material 16 of 220° C. or above, such that process point D is reached.

In the second exemplary embodiment according to FIG. 4, at variance with the first exemplary embodiment according to FIG. 3, once process point B is reached the pressure is simply reduced until a process point B' is reached which is still just above the phase boundary P of the bonding material 18, i.e. still within the liquid phase of the bonding material. Process point B' is for example located at a temperature of 180° C. and a pressure between 10 and 100 mbar.

When process point B' is reached, cleaning agent is, as previously described, introduced into the process chamber in order to clean the components 12A, 12B of contamination. In contrast with the first exemplary embodiment, the bonding material 18 does not yet evaporate at process point B'. Once cleaning is complete, the pressure is further reduced at largely constant temperature until process point C with a temperature of 180° C. and a pressure of between 1 and 10 mbar is reached. The bonding material 18 now begins to evaporate and, together with the cleaning agent, is discharged from the process chamber.

Under approximately constant pressure, the temperature of the solder group 10 is then raised until, at process point D, the liquidus curve L is reached or crossed and the solder material 18 melts and connects with the components 12A, 12B.

It should be noted at this point that the transition between the various process points A, B, B', C and D is only schematic. Temperature and pressure may accordingly at least in places also be simultaneously changed, such that states need not necessarily change isothermally or isobarically. However, prior to establishing the conditions which bring about evaporation of the bonding to material 18, efforts are made to bring the temperature of the solder group 10 as close as possible to the liquidus temperature of the solder material 16 in order as far as possible to minimise the period of time during which the bonding material 18 has already evaporated but the components are not yet connected.

It furthermore goes without saying that pressure deviations may also occur during the process which are caused by evaporation of bonding material 18 and/or solvents or cleaning agents, since any gas which arises can only be cleared from the process chamber by the corresponding vacuum devices of the process chamber with a time delay.

FIG. 5 shows an exemplary temperature/time diagram, on which the time profile of the solder group temperature is indicated by a temperature curve T.

The soldering process may be subdivided into various process phases P1 to P4 which are indicated accordingly in FIG. 5. Various regions or time periods in which specific atmospheric states prevail in the process chamber are furthermore indicated in the diagram. Regions in which a nitrogen atmosphere is present are indicated with reference sign N, regions in which a vacuum (with different pressures) prevails are indicated with the reference sign V and a region in which a cleaning agent atmosphere is present is indicated with the reference sign R.

During a preheating phase P1, the temperature of the solder group is raised to 160° C. to 180° C. A nitrogen atmosphere N is present for most of the duration of the preheating phase P1, wherein a vacuum V is briefly created at the end of the preheating phase P1.

Cleaning phase P2 then follows, in which a cleaning agent atmosphere R prevails and a vacuum V is produced just for a short time at the end. This short vacuum phase indicates the discharge of the evaporated bonding material or cleaning agent. The temperature changes only slightly during the cleaning phase P2.

The preheating phase P1 and the cleaning phase P2 advantageously proceed in a first chamber (preheating chamber) of a multichamber system.

Then, during melting phase P3, the temperature rises to the melting temperature of the solder material of approx. 220° C., wherein a nitrogen atmosphere N is initially present which, once the melting temperature is reached, is replaced by a vacuum V. At the end of the melting phase P3, nitrogen is again introduced into the process chamber, wherein this nitrogen atmosphere N is also maintained during the subsequent cooling phase P4, in which the temperature is reduced to below 50° C.

The melting phase P3 advantageously proceeds in a second chamber (soldering chamber) and the cooling phase P4 in a third chamber (cooling chamber), wherein the two phases P3 and P4 may also proceed in a single chamber.

The individual chambers may advantageously be separated from one another in gas-tight manner and a conveying device for passing the workpiece carriers through the individual chambers is provided, such that higher throughput can be achieved in flow production.

A soldering apparatus 50 of the invention according to a first exemplary embodiment is described below with reference to FIGS. 6 and 7. The stop apparatus described below is advantageously used at least in the cooling chamber during cooling phase P4 while the solder is still liquid. A contact pressure may here act on the top of the components.

The soldering apparatus 50 comprises a base frame 54 and a carrier unit 52 connected with the base frame 54. A substrate 14 of a solder group 10 is placed in the base frame 54 and is preloaded towards the base frame 54 by pressure springs 72 which bear against the carrier unit 52. A pressure plate 64 is spring-mounted by means of pressure springs 70 on the carrier unit 52. The pressure plate 64 has a stop apparatus with a plurality of stop elements 68 which are length-adjustably fastened to the pressure plate 64 by means of adjusting threads. A spring-loaded temperature sensor which can measure the temperature of the substrate 14 is integrated in a through-hole in the base plate 66.

Once the solder group 10 has been placed in the base frame 54 and the carrier unit 52 fastened to the base frame 54, the unit comprising carrier unit 52 and base frame 54 can be inserted into a retaining unit 56, wherein the base frame 54 is fixed by means of guide rollers 58, 60 and retaining strips 62.

The soldering apparatus 50 furthermore comprises a height-adjustable base plate 66 which can come into direct contact with the substrate 14 through the base frame 54 which is open at the bottom.

The soldering apparatus 50 may be arranged, as will be explained in greater detail below, in an evacuatable process chamber.

The base plate 66 and/or the pressure plate 64 may be connected with heat sources and/or heat sinks (not shown) which make it possible to heat or cool the solder group 10. If the base plate 66 is adjusted in the direction of the arrow (FIG. 7) towards the pressure plate 64, the circuit carrier 14, including the components 12A, 12B mounted thereon, is lifted out of the base frame 54 against the force of the pressure springs 72. After a specific adjustment travel, the upper component 12B comes into contact with the pressure plate 64A such that a pressure force is applied to the solder group 10 and the components 12A, 12B or the circuit carrier 14 are compressed until the free end of the stop elements 68 comes into contact with the circuit carrier 14. In this position shown in FIG. 7, the pressure plate 64 and the base plate 66 have reached their minimum spacing, such that the solder group 10 can be no further compressed. As a consequence, it is possible according to FIG. 8 to create a solder group 10 which has a defined height h.

If, instead of the circuit carrier 14, an auxiliary carrier plate (not shown) is placed in the base frame 54, on which one or more components 12A, 12B are merely laid without solder material and in turn solder material 16 is laid on the components 12A, 12B, these components 12A, 12B can be provided, before a solder connection is actually produced, with a coating of melted solder material 16 which likewise has a defined height h (see FIG. 8). The pressure plate 64 may for this purpose be provided with a release agent coating at the contact point with the solder material 16.

Soldering apparatuses 150, 250 according to a second or third exemplary embodiment will now be described with reference to FIGS. 9 and 10 respectively. The soldering apparatuses 150, 250 comprise an evacuatable process chamber 74 which is sealed off from its environment. In the process chamber 74, an only schematically represented retaining unit 56 is shown which receives or mounts a base frame 54. A circuit carrier 14 as a component part of two solder groups 10 is in turn mounted in the base frame 54.

The soldering apparatus 150 (FIG. 9) comprises a pressure plate 64 which is mounted on the process chamber 74.

The soldering apparatus 250 (FIG. 10) comprises a pressure plate 64 which is mounted on the base frame 54 in a similar manner as in the first exemplary embodiment (FIGS. 6 and 7).

The soldering apparatuses 150, 250 further comprise a height-adjustable base plate 66 which may come into contact with the substrate through an opening in the base frame 54. The substrate with the two solder groups 10 may here be pressed against the pressure plate 64. On the pressure plate 64 are fastened stop elements 68 which, once a minimum spacing between the base plate 66 and the pressure plate 64 has been reached, bear on the circuit carrier 14, such that the solder groups 10 are no further compressed and thus have a defined height.

The stop elements 68 may here also be of height-adjustable construction.

The pressure plate 64 may be planar (FIGS. 6, 7 and 10) or according to a variation have one or more projecting steps 76 which come into contact with the solder groups 10 (FIG. 9). The steps 76 may, as shown in FIG. 9, have a somewhat smaller cross-section such that they only come into contact with part of the surface of the uppermost component. As a consequence, a temperature gradient can be produced within the components.

Advantageously, various selective cooling concepts in the context of horizontal alignment may be achieved by the pressure plate. Selective cooling on completion of the soldering operation is known in the prior art, for instance concepts involving exposing a soldered item to coolant vapour from the bottom or mechanically contacting it with cooling pins. It is thus ensured that, during the solidification process, the soldering agent solidifies in defined manner from the inside outwards and thus no voids and defects are formed in the solder's microstructure. The remaining FIGS. 11 to 14 (in each case with distant and applied pressure plate) show various concepts for mechanically contacting a cooling or heating device with the top of a component in order to permit selective control of heating or cooling in such a way that the solidification process of the soldering agent can also be selectively influenced from above by mechanical connection by the pressure plate.

Figure 11B:
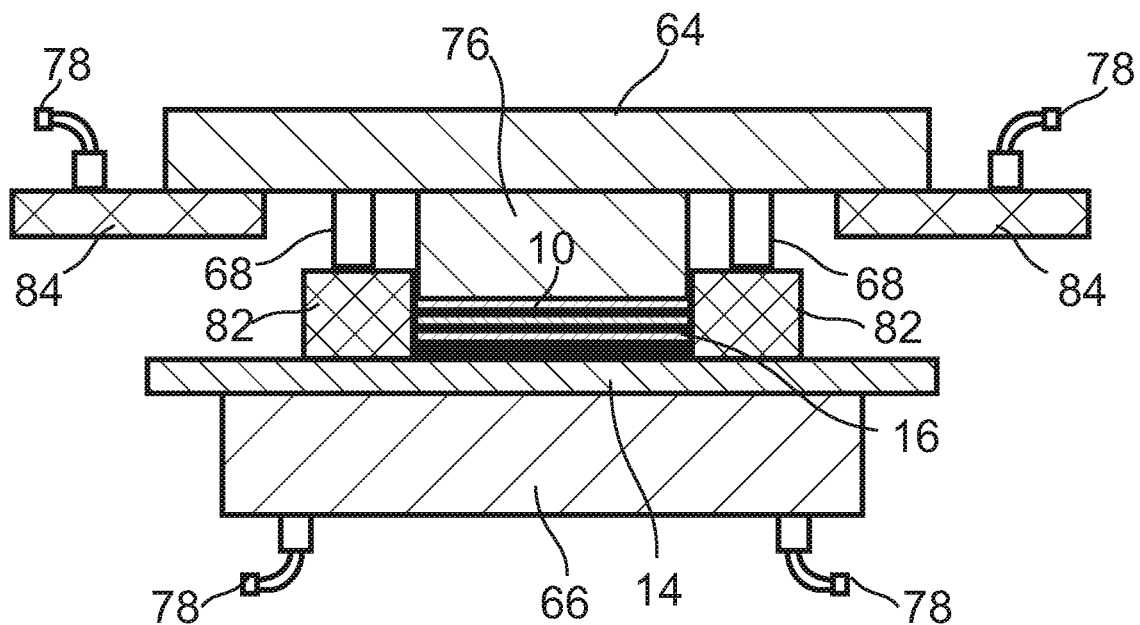

FIGS. 11 to 14 show different embodiments which illustrate various options for selectively cooling or heating solder groups uniformly or nonuniformly from the top:

In FIG. 11*a* (with spaced pressure plate 64), a step 76 of the pressure plate 64, which step is coolable or heatable, is being advanced towards a solder group 10 of stacked components 12 which are connected by means of solder material 16, see FIG. 11*b*, in order to provide cooling/heating from above. Compression travel is limited by stop elements 68 which bear on the top of a component frame 82 or jig. The stop plate 64 is guided by a pressure apparatus retaining to frame 84 which serves as a frame for the pressure plate 64, wherein the retaining frame 84 may be alternatively heated or cooled by means of ports 78 for a thermofluid. The thermofluid may be a pressurised water and glycol mixture which allows the temperature of the pressure plate to be rapidly set. The base plate 66, which carries the circuit carrier 14, may likewise be heated or cooled by a thermofluid by means of ports 78, such that the temperature can be set from both above and below. Prior to application of pressure, the solder material 16 is nonuniformly distributed under the solder group 10, such that the solder group 10 is askew relative to the circuit carrier 14, resulting in a variable solder distribution. After application of pressure in FIG. 11*b*, horizontal alignment may be achieved and solder material uniformly distributed within and below the solder group 10.

Figure 12B:
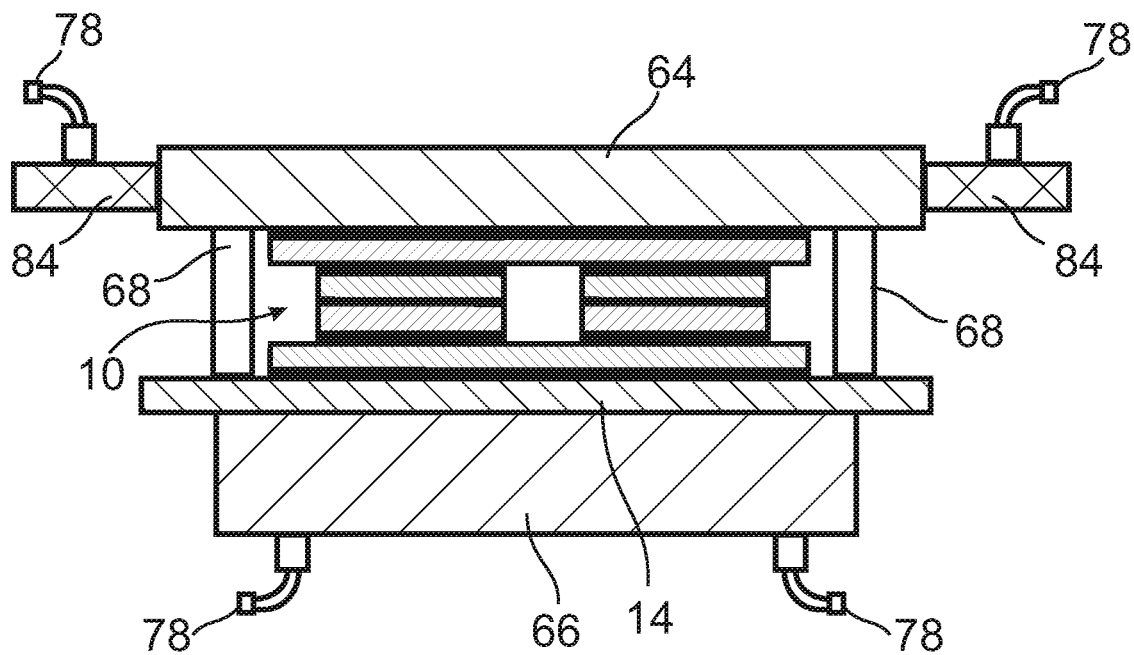

In a configuration, modified relative to FIG. 11, of the exemplary embodiment of FIG. 12*a* (spaced pressure plate 64) and FIG. 12*b* (application of pressure onto the solder group 10), an overall solder group 10 comprising a plurality of components 12*a* to 12*d* is compressed by a single pressure plate 64. The temperature of the pressure plate 64 is in turn adjusted by a retaining frame 84 through which fluid is passed and the temperature of the base plate 66 arranged beneath the solder group 10 may likewise be adjusted via the circuit carrier 14. The solder group includes a plurality of adjacent components 12*c*, 12*d* which are sandwiched by larger components 12*a*, 12*b* as base and cover. Aligning the larger components 12*a*, 12*b*, for example cooling plate and backplane, aligns the smaller components 12*c*, 12*d*.

Figure 13B:
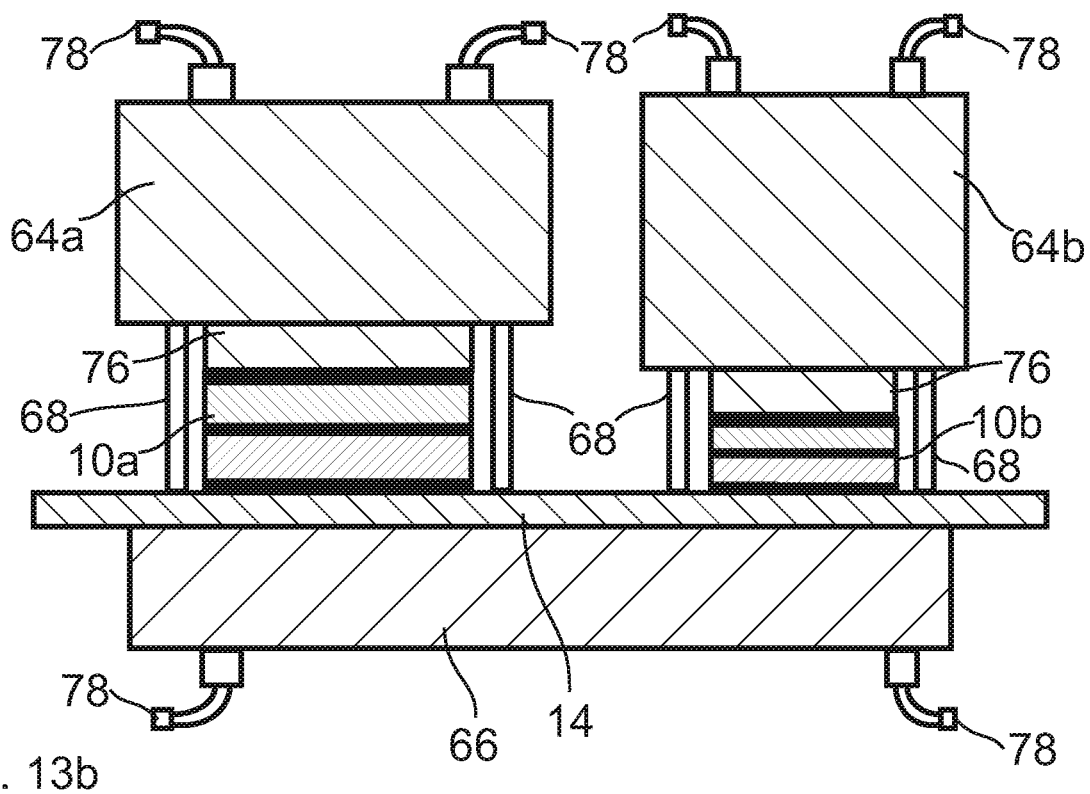

In the embodiment of a stop apparatus shown in FIGS. 13*a*, 13*b* (in respectively open and compressed representation), a plurality of pressure plates 64*a*, 64*b* are provided which may be separately and individually displaced but may also be jointly displaced on a retaining frame 84. The pressure plates 64*a*, 64*b* in each case comprise individually settable pressure elements 68, which may for example have different heights and are separately or jointly temperature-adjustable by means of fluid ports 78. Thanks to steps 76, different solder groups 10*a*, 10*b* can be compressed on a substrate carrier 14 in a manner adapted to the height and size of the surface. In this manner, soldered items 10 of differing heights can be selectively cooled and aligned. Heating or cooling capacity can be individually set on different pressure elements. The various stop elements 76 ensure individually settable stop heights of the pressure plates 64*a*, 64*b*.

Figure 14B:
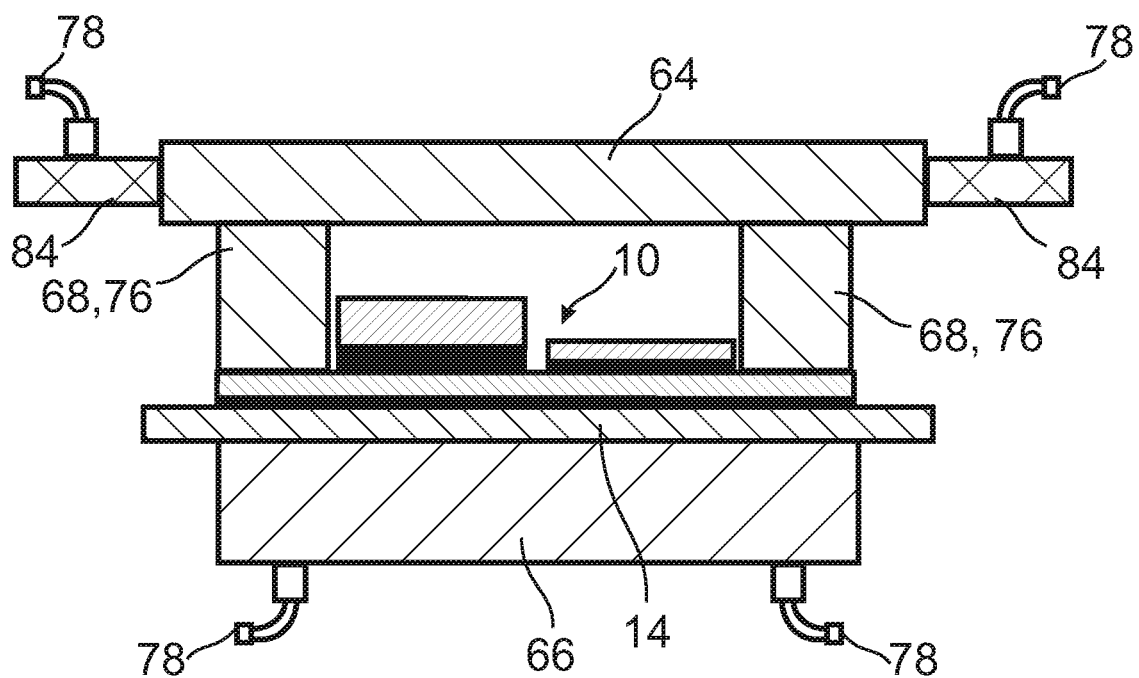

Finally, the embodiment represented in FIGS. 14*a*, 14*b* (open and compressed state) shows a pressure plate 64 without its own cooling or heating device. The temperature of the pressure plate 64 can be indirectly adjusted via a laterally arranged cooling or heating device which is integrated in a retaining frame 84 of the pressure plate 64. The pressure plate 64 may accordingly for example be integrated in a hold-down device and/or may have its temperature adjusted by a cooling or heating device arranged beneath the soldered item. Vertical steps 76 are arranged on the pressure plate which are capable of selectively bearing on individual surface regions of the solder group 10 and are capable of selectively introducing or removing heat. The steps 76 simultaneously serve as stop elements 68. Individual components 12*a* may here be compressed and temperature-adjusted while other, pressure-sensitive components 12*b*, 12*c* of the solder group 10 are left free.

The embodiments shown in FIGS. 11-14 may be used individually or in combination and may synergistically complement and be combined with one another or individually exert their advantageous effect.

In all the embodiments of the soldering apparatus 50, 150, 250 (FIGS. 6 to 14), the components 12A, 12B may be provisionally connected by means of bonding material 18 with one another, with the solder material 16 and/or with the circuit carrier or substrate 14 in the manner described with reference to FIGS. 1 to 5.

LIST OF REFERENCE SIGNS

10 Solder group
12A, 12B Component
14 Substrate/circuit carrier
16 Solder material
18 Bonding material
50, 150, 250 Soldering apparatus
52 Carrier unit
54 Base frame
56 Retaining unit
58, 60 Guide roller
62 Retaining strip
64 Pressure plate
66 Base plate
68 Stop element
70, 72 Pressure spring
74 Process chamber
76 Step
78 Temperature-adjustment fluid port 82 Component frame
84 Pressure apparatus retaining frame
A, B, B', C, D Process point
L Liquidus curve
N Nitrogen atmosphere
P Phase boundary
P1 Preheating phase
P2 Cleaning phase
P3 Melting phase
P4 Cooling phase
R Cleaning agent atmosphere
T Temperature curve
V Vacuum

The invention claimed is:

1. A method for producing a solder connection between a plurality of components in a sealed process chamber, the method comprising, in order:
heating a solder group to an intermediate temperature, the solder group comprising solder material between the plurality of components and a bonding material, wherein the intermediate temperature is lower than a melting temperature of the solder material at atmospheric pressure;
reducing, in a stepwise manner, a pressure in the process chamber, the pressure being initially reduced above an evaporation pressure of the bonding material at the intermediate temperature so the bonding material does not evaporate;
introducing a cleaning agent into the process chamber to clean the solder group, the cleaning agent comprising methanoic acid, hydrogen, or a plasma, wherein a provisional connection by the bonding material between the plurality of components remains;
reducing the pressure in the process chamber below the evaporation pressure of the bonding material at the intermediate temperature such that the bonding material evaporates.

2. The method of claim 1, wherein the bonding material is selected such that the bonding material evaporates during production of a solder connection.

3. The method of claim 2, wherein, when the evaporation pressure is lower than the atmospheric pressure, an evaporation temperature of the bonding material is lower than the melting temperature of the solder material.

4. The method of claim 1, further comprising maintaining the intermediate temperature while reducing the pressure in the process chamber below the evaporation pressure of the bonding material at a predetermined temperature value or within a predetermined temperature range at least until evaporation of the bonding material is complete.

5. The method of claim 1, wherein the bonding material is arranged in a region comprising one or more of an edge, a corner, and a center of the plurality of components or the solder material.

6. The method of claim 1, wherein the solder material melts after the bonding material evaporates.

7. The method of claim 1, wherein the bonding material is liquid or pasty and comprises a terpene alcohol.

8. The method of claim 7, wherein the terpene alcohol is isobornyl cyclohexanol.

9. The method of claim 1, wherein:
the process chamber comprises a soldering apparatus comprising:
a base plate,
a pressure plate, and
a stop apparatus,
the base plate and the pressure plate are adjustable relative to one another with regards to spacing between the base plate and the pressure plate for exerting a pressure force on the solder group received between the base plate and the pressure plate, and
the stop apparatus limits a spacing between the base plate and the pressure plate to a minimum spacing such that, once the solder material in the solder group has melted, the solder group has a predetermined thickness.

10. The method of claim 9, wherein the stop apparatus is arranged on the base plate or the pressure plate.

11. The method of claim 9, wherein the stop apparatus is adjustable such that the minimum spacing can be set.

12. The method of claim 9, wherein the stop apparatus comprises a plurality of length-adjustable stop elements.

13. The method of claim 12, wherein each of the plurality of length-adjustable stop elements comprises an adjusting device that interacts with a complementary adjusting device provided on the base plate or the pressure plate.

14. The method of claim 12, wherein the plurality of length-adjustable stop elements are arranged such that, upon reaching the minimum spacing, the plurality of length-adjustable stop elements bear a respective free end against a component of the solder group, against a base frame carrying one of the components, or against the base plate.

15. The method of claim 9, wherein at least one of the base plate and the pressure plate is constructed of a material that can be heated or cooled.

16. The method of claim 9, wherein the soldering apparatus comprises a carrier unit on which the pressure plate is directly or indirectly spring-supported or spring-mounted.

17. The method of claim 16, wherein a spring force exerted by the pressure plate on the solder group is adjustable.

18. The method of claim 16, wherein the base plate is adjustable relative to the carrier unit.

19. The method of claim 9, wherein a side of the pressure plate associated with the base plate is planar or has at least one projecting step that is in contact with the solder group.

20. The method of claim 19, wherein the at least one projecting step is planar.

* * * * *